United States Patent [19]

Li et al.

[11] Patent Number: 5,712,187
[45] Date of Patent: Jan. 27, 1998

[54] VARIABLE TEMPERATURE SEMICONDUCTOR FILM DEPOSITION

[75] Inventors: Xiaonan Li, Golden; Peter Sheldon, Lakewood, both of Colo.

[73] Assignee: Midwest Research Institute, Kansas City, Mo.

[21] Appl. No.: 555,621

[22] Filed: Nov. 9, 1995

[51] Int. Cl.$^6$ .............................. H01L 21/20; H01L 31/18
[52] U.S. Cl. ........................ 437/109; 136/260; 136/265; 437/5; 437/103
[58] Field of Search ................... 437/5, 103, 109, 437/112; 136/260, 264

[56] References Cited

U.S. PATENT DOCUMENTS

| | | | |
|---|---|---|---|
| 4,207,119 | 6/1980 | Tyan | 136/258 PC |
| 4,650,921 | 3/1987 | Mitchell | 136/258 |
| 4,684,761 | 8/1987 | Devaney | 136/258 |
| 4,709,466 | 12/1987 | McCandless et al. | 437/5 |
| 5,248,349 | 9/1993 | Foote et al. | 136/260 |
| 5,261,968 | 11/1993 | Jordan et al. | 136/244 |
| 5,275,714 | 1/1994 | Bonnet et al. | 205/109 |
| 5,304,499 | 4/1994 | Bonnet et al. | 437/5 |
| 5,501,744 | 3/1996 | Albright et al. | 136/258 |

FOREIGN PATENT DOCUMENTS

| | | | |
|---|---|---|---|
| 2-3992 | 1/1990 | Japan | 136/260 |
| 4-318922 | 11/1992 | Japan | 437/109 |

OTHER PUBLICATIONS

T.L. Chu et al, *Conference Record, 19th IEEE Photovoltaic Specialists Conference* (May 1987), pp. 1466–1469.

*Primary Examiner*—Aaron Weisstuch
*Attorney, Agent, or Firm*—Edna M. O'Connor; Ken Richardson

[57] ABSTRACT

A method of depositing a semiconductor material on a substrate. The method sequentially comprises (a) providing the semiconductor material in a depositable state such as a vapor for deposition on the substrate; (b) depositing the semiconductor material on the substrate while heating the substrate to a first temperature sufficient to cause the semiconductor material to form a first film layer having a first grain size; (c) continually depositing the semiconductor material on the substrate while cooling the substrate to a second temperature sufficient to cause the semiconductor material to form a second film layer deposited on the first film layer and having a second grain size smaller than the first grain size; and (d) raising the substrate temperature, while either continuing or not continuing to deposit semiconductor material to form a third film layer, to thereby anneal the film layers into a single layer having favorable efficiency characteristics in photovoltaic applications. A preferred semiconductor material is cadmium telluride deposited on a glass/tin oxide substrate already having thereon a film layer of cadmium sulfide.

42 Claims, No Drawings

VARIABLE TEMPERATURE SEMICONDUCTOR FILM DEPOSITION

The United States Government has rights in this invention under Contract No. DE AC36-83CH10093 between the United States Department of Energy and the National Renewable Energy Laboratory, a division of the Midwest Research Institute.

BACKGROUND OF THE INVENTION

I. Field of the Invention

The present invention relates to a process for depositing a semiconductor film such as cadmium telluride onto a substrate such as a cadmium sulfide coated photovoltaic precursor device wherein advantageous temperature variations are employed during semiconductor deposition to attain a final film with improved material properties and substantially free of voids to thereby yield improved photovoltaic device performance.

II. Description of the Prior Art

A traditional process employed in the construction of photovoltaic devices uses a vapor deposition process such as a close-space sublimation technique for depositing semiconductor material as a film on a substrate. Such a technique is a physical vapor deposition method that allows vaporized source material to directly transport to the substrate in a low pressure gas ambient. In the prior art, the temperatures of both the source material (the vaporized semiconductor material) and the substrate upon which the semiconductor material is being deposited are kept constant during deposition and ultimate film production.

A common photovoltaic device includes a glass/tin oxide substrate upon which is deposited a first layer of cadmium sulfide and a second layer of cadmium telluride residing atop the cadmium sulfide layer. Utilizing prior art methodology, constant temperature values during vapor deposition such as through sublimation deposition of the cadmium telluride atop the cadmium sulfide are between about 620° C. and about 680° C. for the cadmium telluride source material, and between about 450° C. and about 640° C. for the substrate, depending upon ambient conditions such as pressure, composition makeup, and the like.

While deposition of cadmium telluride does occur in this prior-art methodology, the constant-temperature maintenance of the substrate during film formation tends to produce a photovoltaic device whose operating performance is not outstanding. In particular, while a constant higher temperature can yield improved material properties of the deposited film, these elevated temperatures result in excessive junction alloying and in the formation of voids in the deposited material which reduces performance characteristics of a finished photovoltaic device. Further, if the constant temperature is too high for an extended period of time, the base glass of the substrate can begin to soften or otherwise be damaged and result in an inoperative photovoltaic device. It is therefore apparent that a need is present for methodology that achieves a film deposition quality whereby a photovoltaic device having improved efficiency can be constructed.

Accordingly, a primary object of the present invention is to provide a method of depositing a semiconductor material on a substrate wherein temperature values are varied during film deposition to thereby substantially improve material properties and improve device performance.

Another object of the present invention is to provide a method of depositing a semiconductor material film whereby a first activity comprises film deposition employing a high temperature to thereby favor large grain growth and improve material quality; a second activity comprises film deposition employing a low temperature to thereby favor small grain growth and plugging of voids formed during the first deposition activity; and a third activity comprises employment of a high temperature either with or without continual film deposition whereby the deposited films are annealed.

These and other objects of the present invention will become apparent throughout the description of the invention which now follows.

SUMMARY OF THE INVENTION

The present invention is a method of depositing a semiconductor material on a substrate. To accomplish the invention, the method sequentially comprises, first of all, providing the semiconductor material in a depositable state such as a vapor for deposition on the substrate. Second, the method further comprises depositing the semiconductor material on the substrate while heating the substrate for a time sufficient and to a first temperature sufficient to cause the semiconductor material to form a first semiconductor material film layer having a first grain size. Third, the method further comprises continually depositing the semiconductor material on the substrate while cooling the substrate for a time sufficient and to a second temperature sufficient to cause the semiconductor material to form a second semiconductor material film layer deposited on the first film layer and having a second grain size smaller than the first grain size. Fourth, the method further comprises heating the substrate for a time sufficient and to a third temperature sufficient to anneal the deposited semiconductor material. During this annealing step additional semiconductor material can be deposited and simultaneously annealed, or no additional material is deposited and the material of the first and second layers only is annealed.

A preferred method is the deposition of cadmium telluride on an already-deposited cadmium sulfide film disposed on a substrate which can be a conventional glass/tin oxide substrate. The method comprises the sequential steps of: (a) providing the cadmium telluride in a vapor state such as by a close-space sublimation process for deposition on the substrate; (b) depositing the cadmium telluride on the substrate while heating the substrate for a time sufficient and to a first temperature between about 575° C. and about 640° C. to produce a large-grain film layer; (c) continually depositing the cadmium telluride on the substrate while cooling the substrate for a time sufficient and to a second temperature between about 400° C. and about 510° C. to produce a small-grain film layer atop the large-grain film layer; and (d) heating the substrate for a time sufficient and to a third temperature between about 575° C. and about 640° C., while either depositing or not depositing a third layer of cadmium telluride, to thereby anneal all layers into a single cadmium telluride film.

By employing the high-low-high temperature profile of this invention during semiconductor deposition, advantageous grain size and grain boundary characteristics are attained to thereby improve open circuit voltage and conversion efficiency of the so-constructed photovoltaic device. In particular, deposition during a segment of about 20 seconds in duration at the first temperature of the substrate favorably results in improved grain growth, well defined crystalline nuclei and reduced grain boundary recombination. Simultaneously, however, voids appear in the film so produced, and these voids act as shunt paths in finished photovoltaic devices, thereby unfavorably reducing device fill factor and open circuit voltages. Cooling the substrate to the second temperature value results in the deposition of a thin, small-grain film on top of the initial large-grain first film. This small-grain film substantially plugs the aforementioned voids in the large-grain film. Finally, to maintain the bulk cadmium telluride film quality after deposition of the lower-temperature plugging layer, raising the substrate temperature while either continuing or not continuing to deposit semiconductor material results in the annealing of large-grain and small-grain film layers into a single layer having favorable efficiency characteristics in photovoltaic applications.

DETAILED DESCRIPTION OF A PREFERRED EMBODIMENT

The present invention is a method for depositing a semiconductor film layer on a substrate for ultimate construction of a photovoltaic device. A preferred semiconductor compound is cadmium telluride deposited on a glass/tin oxide substrate already having thereon a film layer of cadmium sulfide as known in the art. The following Example describes in detail the deposition of a cadmium telluride film on a substrate while the substrate temperature is varied to thereby improve film quality and efficiency.

EXAMPLE

Experimentation employing a close-space sublimation process was performed within a standard, vacuum-sealed, quartz tube having a gas inlet and exhaust tubes. Source material was a 200 μm thick cadmium telluride polycrystalline film deposited on a standard 7059 glass plate and separated from the substrate by about 2 mm. The substrate was standard 7059 glass having thereon a tin oxide film upon which was an exposed cadmium sulfide film. Both the substrate and the source material were in contact with respective graphite susceptors each independently heated by independently-controlled 2,000-watt quartz lamps. Two thermocouples were used to monitor the temperatures of the source and substrate, respectively.

Employing the above-described apparatus, an ambient pressure of about 5 to 30 Torr., most preferably about 10 Torr., was established, the cadmium telluride source material was heated to between about 620° C. and 700° C., and the substrate was heated simultaneously to between about 575° C. and 640° C., with such heating occurring over about a two-minute period. Cadmium telluride begins to sublimate very slowly at about 400° C., but only when its temperature is at least 630° C. does the deposition rate become practically significant. The temperature of the substrate (between about 600° C. and 640° C.) ensures large-grain cadmium telluride film formation on the cadmium sulfide layer already disposed on the substrate. It is important to maintain a temperature differential between the source and the substrate during deposition of the first cadmium telluride layer which is sufficient to ensure that cadmium sulfide loss from the substrate is minimized and that large grain cadmium telluride can form. In the embodiment here described, the temperature differential is between about 20° C. and 40° C. Substantially immediately after reaching the above source material and substrate temperatures, these temperatures were decreased to an appropriate value for desired deposition rate of cadmium telluride (as determined by cadmium telluride source material temperature) and for grain-size of deposited cadmium telluride film on the substrate (as determined by substrate temperature). Specifically, the temperature of the source material was lowered to between about 630° C. and about 650° C. and there maintained for the remainder of the procedure, while the temperature of the substrate was lowered to between about 490° C. and 510° C. over a period of about two minutes. During this two-minute period, a layer of small-grain cadmium telluride film was deposited atop the large-grain film previously deposited. Substantially immediately thereafter, the substrate was heated to an annealing temperature of between about 600° C. and 640° C. and maintained thereat while cadmium telluride deposition continued over a period of about two minutes. Thereafter, heating of both the source material and the substrate was stopped and the source and substrate were allowed to cool to ambient temperature prior to removal of the substrate.

An analysis of the photovoltaic device employing the exemplified substrate shows an open circuit voltage of 0.8272 volts; a short circuit current value of 20.46 mA/cm$^2$; a fill factor of 70.84%; and an efficiency of 12.0%. Conversely, analysis of a photovoltaic device employing a cadmium sulfide/cadmium telluride substrate constructed in a traditional close-space sublimation process where source-material temperature and substrate temperature are held constant throughout cadmium telluride deposition shows an open circuit voltage of 0.7743 volts; a short circuit current value of 20.08 mA/cm$^2$; a fill factor of 66.91%; and an efficiency of 10.4%. It is therefore evident that the inventive methodology here described provides significant structural and device performance improvements over traditional close-space sublimation procedures. The as-deposited final film properties show significantly increased grain size with accompanying reduced grain boundary recombination. Further, shunting is reduced for optimized cadmium telluride film thicknesses. Indeed, and as shown in the above-recited analyses comparing traditional close-space sublimation methodology with the variable temperature close-space sublimation methodology of the present invention, the methodology of the present invention shows open circuit voltage and conversion efficiency improvements on the order of about 10%. Therefore, the present inventive methodology substantially improves material properties by reducing grain boundary recombination and void density to thereby significantly improve photovoltaic-device efficiency.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

We claim:

1. A method of depositing a semiconductor material on a substrate, the method comprising the sequential steps of:

a) providing the semiconductor material in a depositable state for deposition on the substrate;

b) depositing the semiconductor material on the substrate while heating the substrate for a time sufficient and to a first temperature sufficient to cause the semiconductor material to form a first semiconductor material film layer contiguous to the substrate and having a first grain size;

c) continually depositing the semiconductor material on the substrate while cooling the substrate for a time sufficient and to a second temperature sufficient to cause the semiconductor material to form a second semiconductor material film layer deposited on the first film layer and having a second grain size smaller than the first grain size; and d) continually depositing the semiconductor material on the substrate while heating the substrate for a time sufficient and to a third temperature sufficient to cause the semiconductor material to form a third semiconductor material film layer on the second film layer and substantially simultaneously anneal the first, second third film layers.

2. A method as claimed in claim 1 wherein the depositable state is a vapor state.

3. A method as claimed in claim 2 wherein the substrate includes a film layer of a different semiconductor material that was deposited previously and upon which the first semiconductor material film layer is deposited.

4. The method of claim 3, wherein said first semiconductor material film layer and said second semiconductor material film layer both comprise cadmium telluride and said different semiconductor material comprises cadmium sulfide.

5. A method as claimed in claim 2 wherein the steps are performed in a vacuum of from about 5 to about 30 Torr.

6. A method as claimed in claim 2 wherein the vapor state is attained by a close-spaced sublimation process.

7. A method of depositing cadmium telluride on a substrate, the method comprising the sequential steps of:

a) providing the cadmium telluride in a depositable state for deposition on the substrate;

b) depositing the cadmium telluride on the substrate while heating the substrate for a time sufficient and to a first temperature sufficient to cause the cadmium telluride to form a first cadmium telluride film layer contiguous to the substrate and having a first grain size;

c) continually depositing the cadmium telluride on the substrate while cooling the substrate for a time sufficient and to a second temperature sufficient to cause the cadmium telluride to form a second cadmium telluride film layer deposited on the first film layer and having a second grain size smaller than the first grain size; and d) continually depositing the cadmium telluride on the substrate while heating the substrate for a time sufficient and to a third temperature sufficient to cause the cadmium telluride to form a third cadmium telluride film layer on the second film layer and substantially simultaneously anneal the first, second, and third film layers.

8. A method as claimed in claim 7 wherein the depositable state is a vapor state.

9. A method as claimed in claim 8 wherein the substrate includes a film layer of cadmium sulfide that was deposited previously and upon which the first cadmium telluride film layer is deposited.

10. A method as claimed in claim 9 wherein the steps are performed in a vacuum of from about 5 to about 30 Torr.

11. A method as claimed in claim 10 wherein the first temperature is between about 575° C. and about 640° C.

12. A method as claimed in claim 11 wherein the second temperature is between about 400° C. and about 510° C.

13. A method as claimed in claim 12 wherein the third temperature is between about 575° C. and about 640° C.

14. A method of depositing by a vapor deposition process cadmium telluride on a substrate having a cadmium sulfide film already disposed thereon, the method comprising the sequential steps of:

a) providing a vacuum of from about 5 to about 30 Torr. in a space within which the method is performed;

b) providing the cadmium telluride in a vapor state for deposition on the substrate;

c) depositing the cadmium telluride on the substrate while heating the substrate for about two minutes to a first temperature between about 575° C. and about 640° C. to cause the cadmium telluride to form on top of the cadmium sulfide film layer a first cadmium telluride film layer having a first grain size;

d) continually depositing the cadmium telluride on the substrate while cooling the substrate for about two minutes to a second temperature between about 400° C. and about 510° C. to cause the cadmium telluride to form a second cadmium telluride film layer deposited on the first film layer and having a second grain size smaller than the first grain size; and e) continually depositing the cadmium telluride on the substrate while heating the substrate for about five minutes to a third temperature between about 575° C. and about 640° C. to cause the cadmium telluride to form a third cadmium telluride film layer on the second film layer and substantially simultaneously anneal the first, second) and third film layers.

15. A method as claimed in claim 14 wherein the vapor deposition process is a close-spaced sublimation process.

16. A method of depositing a semiconductor material on a substrate, the method comprising the sequential steps of:

a) providing the semiconductor material in a depositable state for deposition on the substrate;

b) depositing the semiconductor material on the substrate while heating the substrate for a time sufficient and to a first temperature sufficient to cause the semiconductor material to form a first semiconductor material film layer contiguous to the substrate and having a first grain size;

c) continually depositing the semiconductor material on the substrate while cooling the substrate for a time sufficient and to a second temperature sufficient to cause the semiconductor material to form a second semiconductor material film layer deposited on the first film layer and having a second grain size smaller than the first grain size; and d) heating the substrate for a time sufficient and to a third temperature sufficient to anneal the first and second film layers.

17. A method as claimed in claim 16 wherein the depositable state is a vapor state.

18. A method as claimed in claim 17 wherein the substrate includes a film layer of a different semiconductor material that was deposited previously and upon which the first semiconductor material film layer is deposited.

19. The method of claim 18, wherein said first semiconductor material film layer and said second semiconductor material film layer both comprise cadmium telluride and said different semiconductor material comprises cadmium sulfide.

20. A method as claimed in claim 17 wherein the steps are performed in a vacuum of from about 5 to about 30 Torr.

21. A method as claimed in claim 17 wherein the vapor state is attained by a close-spaced sublimation process.

22. A method for depositing a semiconductor material comprising a Group II–VI compound on a substrate, the method comprising:

(a) providing the semiconductor material in a depositable state for deposition on the substrate;

(b) depositing the semiconductor material on the substrate while heating the substrate for a time sufficient and to a first temperature sufficient to cause the semiconductor material to form a first semiconductor material film layer contiguous to the substrate and having a first grain size;

(c) continually depositing the semiconductor material on the substrate while cooling the substrate for a time sufficient and to a second temperature sufficient to cause the semiconductor material to form a second semiconductor material film layer deposited on the first film layer and having a second grain size smaller than the first grain size; and (d) heating the substrate for a time sufficient and to a third temperature sufficient to anneal the first and second film layers.

23. A method for depositing semiconductor material on a substrate, comprising the steps of:

(a) heating the semiconductor material and the substrate simultaneously while keeping the temperature differential between the semiconductor material and the substrate within 40° C. to reach a temperature range for the semiconductor material that is sufficient to provide the semiconductor material in a depositable condition and to reach a first temperature range for the substrate that is sufficient to result in deposition of the semiconductor material on the substrate in a first layer that has grain sizes which are larger than the semiconductor material would form at lower substrate temperatures;

(b) continuing deposition of the semiconductor material on the substrate while lowering the temperature of the substrate from the first temperature range to a second temperature range that results in deposition of the semiconductor material in a second layer that has grain sizes which are smaller than grain sizes deposited in the first layer; and (c) heating the substrate to a third temperature range that is sufficiently high to result in annealing the first layer and the second layer of the semiconductor material on the substrate.

24. The method of claim 23, wherein said heating in step (a) occurs within about two minutes.

25. The method of claim 23, wherein said cooling in step (b) occurs within about two minutes.

26. The method of claim 23, wherein said heating in step (c) occurs within about two minutes.

27. The method of claim 23, wherein said semiconductor material is a compound comprising Group II–VI elements.

28. The method of claim 27, wherein said semiconductor material comprises cadmium telluride.

29. The method of claim 23, wherein said first temperature range for the substrate in step (a) is about 575°–640° C.

30. The method of claim 29, wherein said second temperature range for the substrate in step (b) is about 400°–510° C.

31. The method of claim 30, wherein said third temperature range for the substrate in step (c) is about 575°–640° C.

32. The method of claim 23, including continuing to deposit the semiconductor material during the heating in step (c).

33. A method for depositing a semiconductor material on a substrate, the method comprising:

(a) heating the semiconductor material for a time sufficient and to a temperature sufficient to provide the semiconductor material in a depositable state for deposition on the substrate;

(b) depositing the semiconductor material on the substrate while heating the substrate for a time sufficient and to a first substrate temperature sufficient to cause the semiconductor material to form a first semiconductor material film layer contiguous to the substrate and having a first grain size;

(c) continually depositing the semiconductor material on the substrate while cooling the substrate for a time sufficient and to a second substrate temperature that is lower than the first substrate temperature and sufficiently low to cause the semiconductor material to form a second semiconductor material film layer on the first semiconductor material film layer and having a second grain size that is smaller than the first grain size; and (d) heating the substrate for a time sufficient and to a third substrate temperature that is higher than the second substrate temperature and which is sufficiently high to anneal the first and second film layers.

34. A method according to claim 33, wherein the heating of the semiconductor material in step (a) and the heating of the substrate in step (b) occurs substantially simultaneously.

35. A method according to claim 33, wherein the temperature of the semiconductor material in step (a) and the first substrate temperature in step (b) have a differential of between about 20° C. and 40° C.

36. A method according to claim 33, wherein the steps are performed in a vacuum of from about 5 to about 30 Torr.

37. A method according to claim 33, wherein the first substrate temperature is between about 575° C. and about 640° C., the second substrate temperature is between about 400° C. and about 510° C., and the third substrate temperature is between about 575° C. and about 640° C.

38. A method according to claim 33, wherein the heating of the semiconductor material in step (a) occurs over about a two-minute period.

39. A method according to claim 33, wherein the heating of the substrate in step (b) occurs over about a two-minute period.

40. A method according to claim 33, wherein the cooling of the substrate in step (c) occurs over about a two-minute period.

41. A method according to claim 33, wherein the heating of the substrate in step (d) occurs over about a two-minute period.

42. A method according to claim 33, wherein step (d) includes continually depositing the semiconductor material on the substrate to cause the semiconductor material to form a third semiconductor material film layer on the second film layer, and heating the substrate for a time sufficient and to a third temperature sufficient to substantially simultaneously anneal the first, second and third film layers.

* * * * *